United States Patent
Jung et al.

(10) Patent No.: US 9,781,835 B2
(45) Date of Patent: Oct. 3, 2017

(54) PRINTED CIRCUIT BOARD

(71) Applicant: LG INNOTEK CO., LTD., Seoul (KR)

(72) Inventors: Won Suk Jung, Seoul (KR); Kyu Won Lee, Seoul (KR); Yun Ho An, Seoul (KR); Woo Young Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 100 days.

(21) Appl. No.: 14/438,666

(22) PCT Filed: May 9, 2013

(86) PCT No.: PCT/KR2013/004112
§ 371 (c)(1),
(2) Date: Apr. 27, 2015

(87) PCT Pub. No.: WO2014/069734
PCT Pub. Date: May 8, 2014

(65) Prior Publication Data
US 2015/0296625 A1    Oct. 15, 2015

(30) Foreign Application Priority Data
Nov. 2, 2012   (KR) .................. 10-2012-0123386

(51) Int. Cl.
*H05K 1/18*   (2006.01)
*H05K 1/03*   (2006.01)
(Continued)

(52) U.S. Cl.
CPC ......... *H05K 1/186* (2013.01); *H01L 21/4857* (2013.01); *H01L 23/49822* (2013.01);
(Continued)

(58) Field of Classification Search
CPC ...... H05K 1/185; H05K 1/186; H05K 1/0366; H05K 3/007
See application file for complete search history.

(56) References Cited

U.S. PATENT DOCUMENTS 5,841,193 A * 11/1998 Eichelberger ....... H01L 23/5389
                                                          257/723
5,892,287 A *  4/1999 Hoffman ............. H01L 21/6833
                                                          257/686
(Continued)

FOREIGN PATENT DOCUMENTS

KR   10-2006-0043810 A    5/2006
KR   10-2009-0017628 A    2/2009
(Continued)

OTHER PUBLICATIONS

International Search Report for International application No. PCT/KR2013/004112.
(Continued)

*Primary Examiner* — Chau N Nguyen
*Assistant Examiner* — Roshn Varghese
(74) *Attorney, Agent, or Firm* — LRK Patent Law Firm (57) ABSTRACT

Provided is a printed circuit board including: an insulating layer; electronic devices embedded in the insulating layer; and an adhesive layer for fixing the electronic devices.

13 Claims, 7 Drawing Sheets

(51) Int. Cl.

| | |
|---|---|
| *H05K 1/16* | (2006.01) |
| *H05K 3/30* | (2006.01) |
| *H05K 3/46* | (2006.01) |
| *H01L 23/00* | (2006.01) |
| *H05K 1/02* | (2006.01) |
| *H05K 1/11* | (2006.01) |
| *H01L 23/498* | (2006.01) |
| *H01L 21/48* | (2006.01) |
| *H01L 23/538* | (2006.01) |
| *H01L 23/31* | (2006.01) |

(52) U.S. Cl.
CPC .......... *H01L 23/5389* (2013.01); *H01L 24/19* (2013.01); *H01L 24/20* (2013.01); *H01L 24/97* (2013.01); *H05K 1/0298* (2013.01); *H05K 1/0366* (2013.01); *H05K 1/115* (2013.01); *H05K 3/305* (2013.01); *H05K 3/4602* (2013.01); *H01L 21/486* (2013.01); *H01L 23/3135* (2013.01); *H01L 23/49827* (2013.01); *H01L 2224/04105* (2013.01); *H01L 2224/2402* (2013.01); *H01L 2224/32225* (2013.01); *H01L 2224/32245* (2013.01); *H01L 2224/82039* (2013.01); *H01L 2224/83005* (2013.01); *H01L 2224/8314* (2013.01); *H01L 2224/83191* (2013.01); *H01L 2224/92144* (2013.01); *H01L 2224/97* (2013.01); *H01L 2924/15787* (2013.01); *H01L 2924/15788* (2013.01); *H05K 1/185* (2013.01); *H05K 2201/0195* (2013.01); *H05K 2201/1003* (2013.01); *H05K 2201/10015* (2013.01); *H05K 2201/10022* (2013.01); *H05K 2201/10984* (2013.01); *Y02P 70/613* (2015.11)

(56) References Cited

U.S. PATENT DOCUMENTS

| | | | |
|---|---|---|---|
| 6,335,076 | B1 | 1/2002 | Nakamura et al. |
| 7,247,523 | B1* | 7/2007 | Huemoeller ........ H01L 21/6835 257/E23.178 |
| 8,763,241 | B2* | 7/2014 | Inagaki ............... H01L 21/4857 29/25.42 |
| 8,884,424 | B2* | 11/2014 | Su ...................... H01L 21/4857 257/700 |
| 2005/0211465 | A1 | 9/2005 | Sunohara et al. |
| 2005/0284655 | A1 | 12/2005 | Hsu et al. |
| 2009/0107715 | A1 | 4/2009 | Sasaoka |
| 2011/0083892 | A1 | 4/2011 | We et al. |
| 2011/0291293 | A1* | 12/2011 | Tuominen ............ H05K 1/0271 257/774 |

FOREIGN PATENT DOCUMENTS

| | | |
|---|---|---|
| KR | 10-2010-0113303 A | 10/2010 |
| KR | 10-2011-0093408 A | 8/2011 |
| KR | 10-2011-0124565 A | 11/2011 |
| KR | 10-1086835 B1 | 11/2011 |
| KR | 10-2011-0130604 A | 12/2011 |
| TW | 493367 B | 7/2002 |
| TW | I296492 B | 5/2008 |

OTHER PUBLICATIONS

TIPO Office Action for Taiwanese Patent Application No. 102118459 which corresponds to the above-identified application.
European search report for European Patent Application No. 13850174.7.

* cited by examiner

PRINTED CIRCUIT BOARD

CROSS-REFERENCE TO RELATED APPLICATIONS

This application claims priority under 35 U.S.C. §119 to Korean Application No. 10-2012-0123386, filed on Nov. 2, 2012 in the Korean Intellectual Property Office, whose entire disclosure is hereby incorporated by reference.

TECHNICAL FIELD

The present invention relates to a printed circuit board.

BACKGROUND ART

A printed circuit board (PCB) is formed by printing a circuit line pattern on an electrical insulating substrate with a conductive material such as Cu and means a board just before electronic components are mounted. That is, it means a circuit board which is configured such that to closely mount various kinds of electronic devices on a flat board, a mounting position of each component is fixed, and the circuit board is fixed by printing the circuit pattern for connecting the components on a surface of the flat board.

Recently, an embedded printed circuit board in which each component is embedded and mounted has been provided.

Figure 1:
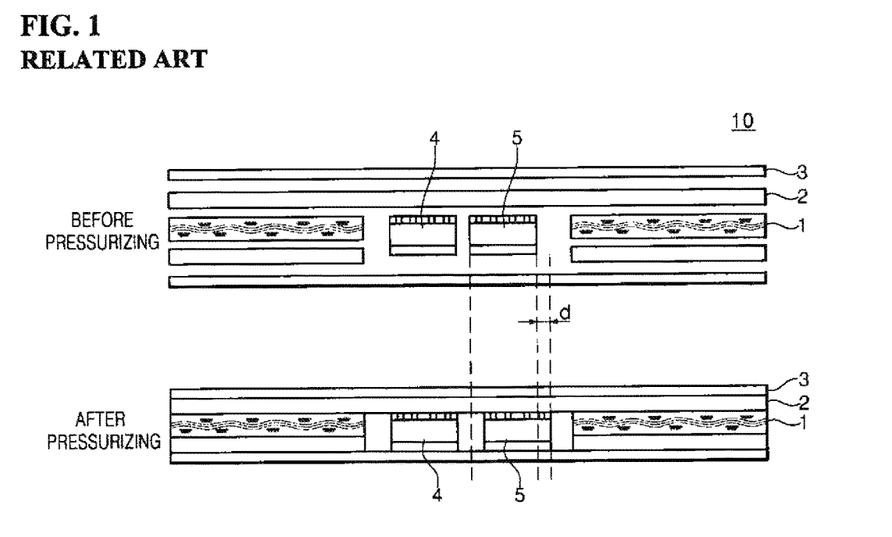
FIG. 1 is a cross-sectional view of a printed circuit board according to a conventional art.

FIG. 1 illustrates a general embedded printed circuit board.

Referring to FIG. 1, a general embedded printed circuit board 10 is configured such that electronic devices 4, 5 are embedded among a plurality of insulating layers 1, 2, 3, and an embedded circuit pattern for applying electricity to the plurality of insulating layers 1, 2, 3, and a via hole for connecting circuits of different layers from each other are formed.

The embedded electronic devices 4, 5 have a solder or a buffer formed in an upper part thereof.

The electronic devices 4, 5 are disposed in, a cavity of the insulating layers 1, 2, 3, and then the insulating layers 1, 2, 3 are pressurized to fix the electronic devices 1, 2, 3.

However, when the insulating layers 1, 2, 3 are pressurized, the electronic devices 4, 5 move and rotate, thereby causing a deviation (d) in design.

DISCLOSURE

Technical Problem

An aspect of the present invention provides an embedded printed circuit board which can prevent electronic devices from moving.

Technical Solution

According to an aspect of the present invention, there is provided a printed circuit board, including: an insulating layer; electronic devices embedded in the insulating layer; and an adhesive layer for fixing the electronic devices.

Advantageous Effects

According to the present invention, in the electronic device-embedded printed circuit board, when the electronic devices are mounted, the insulating layer is formed regardless of a thickness of the electronic devices, so a printed circuit board having a desired thickness may be formed regardless a size of the electronic devices.

DESCRIPTION OF DRAWINGS

The accompanying drawings are included to provide a further understanding of the present invention, and are incorporated in and constitute a part of this specification. The drawings illustrate exemplary embodiments of the present invention and, together with the description serve to explain principles of the present invention. In the drawings.

MODE FOR INVENTION

Hereinafter, preferred embodiments of the present invention will be described in detail with reference to the accompanying drawings in such a manner that the present could be easily implemented by those having ordinary skill in the art to which the present invent pertains. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments.

It will be further understood that the terms "comprises" and "includes" and/or "comprising," and "including" when used in this specification, specify the presence of stated features, integers, steps, operations, elements, and/or components, but do not preclude the presence or addition of one or more other features, integers, steps, operations, elements, components, and/or groups thereof.

To clearly explain the present invention, the parts which have no relation with the explanation are omitted, and to clearly express various layers and areas, their thicknesses are enlarged. Also, like numbers may refer to like elements throughout the description of the figures.

When it is mentioned that a part such as a layer, a film, an area, a plate and the like is "above" other part, this includes a case in which the part is just above the other part as well as a case in which still another part is present in their middle. On the contrary, when it is mentioned that a part is just above other part, this means that there is no still another part in their middle.

With respect to an embedded printed circuit board in which electronic devices 200 are embedded and mounted, the present invention provides a printed circuit board to which the electronic devices 200 may be mounted without any movement.

Hereinafter, the explanation on the printed circuit board according to an exemplary embodiment of the present invention will be described with reference to FIG. 2 to FIG. 21.

Figure 2:
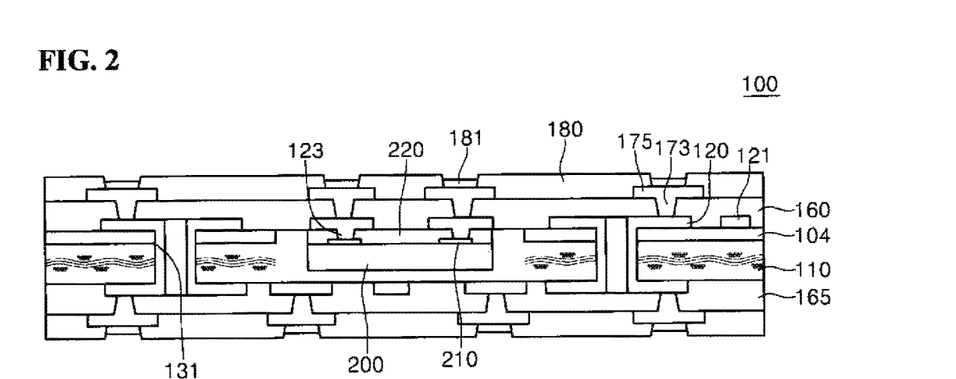
FIG. 2 is a cross-sectional view of a printed circuit board according to an exemplary embodiment of the present invention.

FIG. 2 is a cross-sectional view of a printed circuit board according to an exemplary embodiment of the present invention.

Referring to FIG. 2, the printed circuit board 100 according to the present invention includes: an first insulating layer 110; an inner circuit pattern 121 formed on and below the first insulating layer 110; a guide layer 104 disposed between the first insulating layer 110 and the inner circuit pattern 121; a second insulating layer 160 and a third insulating layer 165 formed in an upper part and a lower part of the first insulating layer 110; an outer circuit pattern 175 and a cover lay 180 formed above the second and third insulating layer 160, 165; and a plurality of electronic devices embedded in the printed circuit board 100.

The first to third insulating layers 110, 160, 165, which form an insulating plate, may be a thermosetting or thermoplastic polymer substrate, a ceramic substrate, an organic-inorganic composite material substrate or a glass fiber-impregnated substrate. When a polymer resin is included therein, an epoxy-based insulating resin may be included. However, unlike this, a polyimide-based resin may be included.

The first to third insulating layers 110, 160, 165 may be formed of different materials from each other. As one example, the first insulating layer 110 may be an impregnated substrate in which glass fabric is included, and the second and third insulating layers 160, 165 may be configured of an insulating sheet which is formed of only resin.

The first insulating layer 110 may be formed to be thicker than the second and third insulating layers 160, 165.

The first insulating layer 110 may include a device arrangement part for mounting the electronic devices 200, the inner circuit pattern may be formed in an upper part and a lower part of the first insulating layer 110, respectively, and a conductive via 120 for connecting the inner circuit pattern 121 of the upper part and the lower part may be also formed in the upper and lower parts of the first insulating layer 110.

The guide layer 104 is disposed between the first insulating layer 110 and the inner circuit pattern 121 and functions to guide an arrangement of the electronic devices 200.

Explaining it more specifically, the guide layer 104 forms a device area in which the electronic devices are disposed, and which has an opening shape, and the device area of the guide layer 104 is formed to have a larger width than that of the electronic devices 200.

At this time, the guide layer 104 may be configured to be disposed on only one surface of the first insulating layer 110 and may configured to be disposed between the first insulating layer 110 and an external insulating layer. For example, as illustrate in FIG. 2, the guide layer 104 may be disposed between the first insulating layer 110, and the second insulating layer 160 which is the external insulating layer.

Meanwhile, the guide layer 104 may be formed of an insulating layer including a resin material.

The outer circuit pattern 175 may be formed in an upper part of the second and third insulating layers 160, 165 which are formed in the upper part and the lower part of the first insulating layer 110, respectively.

A part of the outer circuit pattern 175 may be connected to a terminal of the electronic devices 220.

A via 173, which passes through the second and third insulating layers 160, 165, is formed between the outer circuit pattern 175 and the electronic devices 200.

The via 173 may be formed on only one surface of the electronic devices 200 or may be formed in both the upper part and the lower part.

The electronic devices 200 embedded by the first to third insulating layer 110, 160, 165 may be a positive element or an active element. For example, the electronic devices 200 may be a resistor, an inductor, a capacitor or an integrated circuit (IC). A terminal 210 for receiving currents or pressures supplied from the outside is formed on an upper surface or a lower surface of the electronic devices.

An adhesive layer 220, which covers the terminal 210 of the electronic devices 200, is formed in a direction in which the terminal 210 of the electronic devices 200 is formed. The adhesive layer 220 may be formed to have a same width as that of the electronic devices 200, or may be formed to have a larger width than that of the electronic devices 200.

The adhesive layer 220 may be configured such that an adhesive paste is coated on both surfaces of a dry film, and the terminal 210 is in contact with one surface on which the adhesive paste is coated.

A thickness of the adhesive layer 220 may vary depending on pressure, and the adhesive layer 200 may be formed of an insulating material.

The electronic devices 200 are disposed in the first insulating layer 110 and are bonded to one surface of the second insulating layer 160, which is the external insulating layer, using the adhesive layer 220. One surface of the adhesive layer 220 is in contact with the electronic devices 200, and another surface of the adhesive layer 220 is in contact with the second insulating layer 160 which is the external insulating layer.

Thus, as illustrated in FIG. 2, the another surface of the adhesive layer and the one surface of the first insulating layer 110 are disposed in one plane. The adhesive layer 220 further includes a via 123 which connects the inner circuit pattern 121 and the terminal 210 of the electronic devices 220.

Unlike the conductive via 120, the via 123 may be configured such that an inner part thereof is embedded of a conductive material. The via 123 and the outer circuit pattern 175 are connected through the via 173.

The pad 175 connected to the via 173 may be extended to an upper surface of the second and third insulating layer 160, 165.

The inner circuit pattern 121 and the outer circuit pattern 175 may be formed of an alloy including Cu, and the inner circuit pattern 121 and the outer circuit pattern 175 may be formed in at least two layers.

The outer circuit pattern 175 is protected by the cover ray 180 from the outside.

The cover ray 180 may be formed of a dry film or a general solder resist, and may be formed to open a part of the outer circuit pattern 175 as a pad.

A surface treatment layer 181 is formed on an upper surface of the opened pad.

The surface treatment layer 181 may be a plating treatment layer 181 or an organic film treatment layer.

In the above, it is explained that the circuit patterns 121, 175 are formed in two layers. However, unlike this, the circuit patterns may be formed in a plurality of layers.

In the printed circuit board 100, since the guide layer 104 and the adhesive layer 220 are formed so that the electronic devices 200 to be embedded do not move, a deviation in array between the laser via 173 and the device terminal 210 may be improved. Also, since a thickness of the adhesive layer 220 is variable, a pitch of the terminal may be reduced to less than 150 μm by controlling a size of the laser via 173.

Also, the adhesive layer 220 enables a connection among layers to be performed, thereby enabling an asymmetrical connection to be performed.

Hereinafter, a method of manufacturing the printed circuit board 100 will be explained with reference to FIG. 3 to FIG. 21.

FIG. 3 to FIG. 21 are cross-sectional views showing the method of manufacturing the printed circuit board 100 according to one exemplary embodiment of the present invention.

Figure 3:
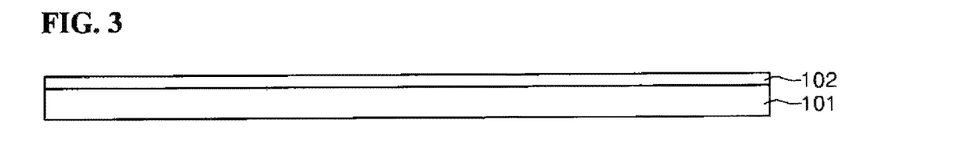
FIG. 3 through FIG. 21 are cross-sectional views showing a method of manufacturing the printed circuit board of FIG. 2.

First, as illustrated in FIG. 3, a base board is prepared.

The base board, is a support board for lamination of the printed circuit board, may be formed by laminating a copper foil layer 102 on an insulating carrier board 101.

Figure 4:
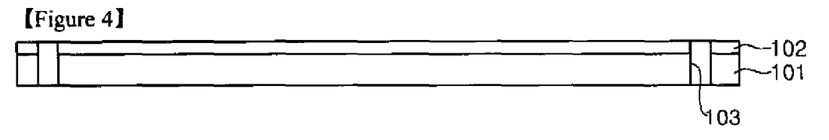

Next, as shown in FIG. 4, an active area is defined by forming a groove 103 in an edge of the base board using a drill.

In the active area, is an area in which devices and patterns are formed, a plurality of printed circuit boards is simultaneously formed, and thereafter is divided into each printed circuit board by cutting the printed circuit boards.

Figure 5:
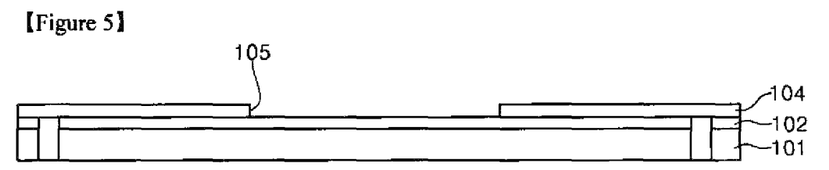

Next, the guide layer 104 is formed on the copper foil layer 102.

The guide layer 104 forms a device area 105 in which the electronic devices 200 are disposed, and which has an opening shape. The guide layer 104 functions to guide an arrangement of the electronic devices 200, and the device area 105 of the guide layer 104 is formed to have a larger width than that of the disposed electronic devices.

The guide layer 104 may be formed of an insulating layer including a resin material. The device area 105 opened by the guide layer 104 may be formed to have a larger size than that of the electronic devices 200.

The guide layer 104 may be formed to cover a groove 103.

Next, the electronic devices 200 are mounted to the device area 105.

The electronic devices 200 may be a passive element or an, active element. For example, the electronic devices 200 may be a resistor, an inductor or a capacitor.

Figure 6:
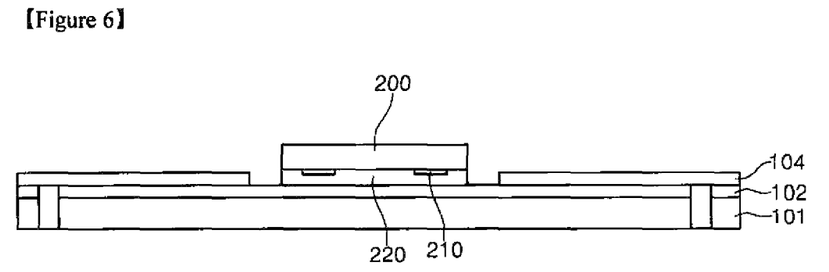

First, as shown in FIG. 6, the mounting of the device is performed by bonding the adhesive layer 220 onto a surface on which the terminal of the electronic devices 200 is formed.

The adhesive layer 220 may be formed using an insulating film, in which an adhesive paste is coated on both surfaces of a dry film, and the adhesive layer 220 may be formed to have a width identical to or larger than that of the electronic devices 200.

One adhesive surface of the adhesive layer 220 is disposed to be in contact with the terminal 210, and another adhesive surface is disposed to be in contact with the device area 105. Accordingly, the adhesive layer 220 is configured to cover the terminal 210.

Next, the electronic devices 200 are fixed to the device area 105 by hardening the adhesive layer 220.

Figure 7:
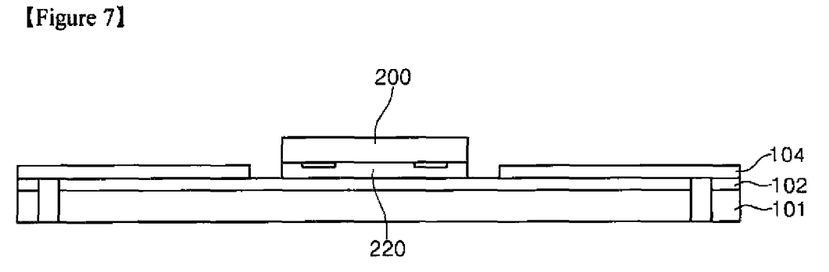

As shown in FIG. 7, the electronic devices 200 are disposed to be spaced apart from the guide layer 104 at a predetermined distance.

Figure 8:
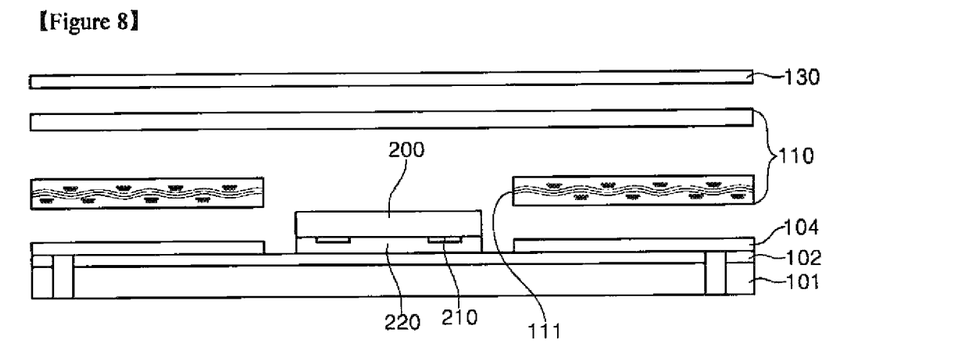

Next, the first insulating layer 110 of FIG. 8 is formed.

The first insulating layer 110 may be formed in a laminated structure having a plurality of insulating layers and may be a prepreg having glass fabric in an inner part thereof.

The first insulating layer 110 may be formed in a lower layer and an upper layer. The lower layer may include the prepreg, and the upper layer may be formed of only an insulating resin.

The lower layer may be formed to have an opening 111 which opens the electronic devices 200, and the upper layer may be formed to cover an upper part of the electronic devices 200. A copper foil layer 130 is also bonded onto the first insulating layer 110.

Figure 9:
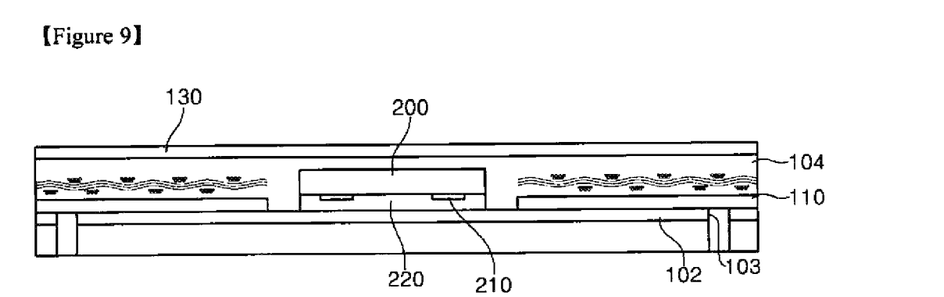

Next, a laminated structure of FIG. 9 is formed by pressurizing the laminated structure of FIG. 8 at a high temperature and hardening it.

Thanks to the pressurizing process, resin is penetrated from the first insulating into a spaced gap among the electronic devices 200 and the insulating layer, thereby enabling the electronic devices 200 to be fixed as, shown in FIG. 9.

Figure 10:
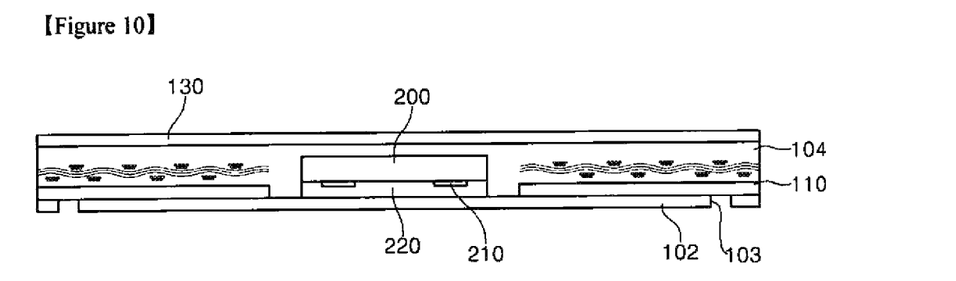

When the hardening of the first insulating layer 110 is completed, the copper foil layer is exposed by removing the carrier board 101.

Figure 11:
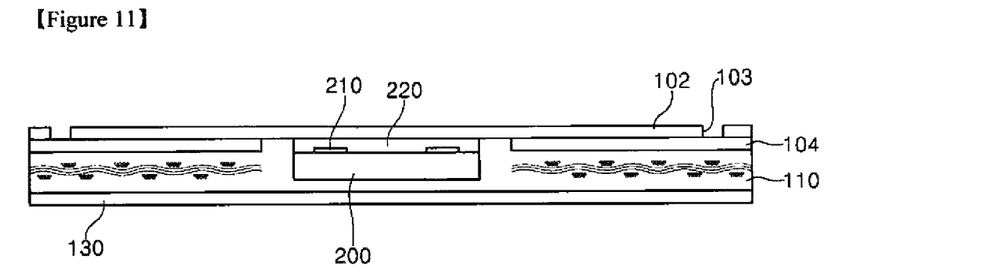
Figure 12:
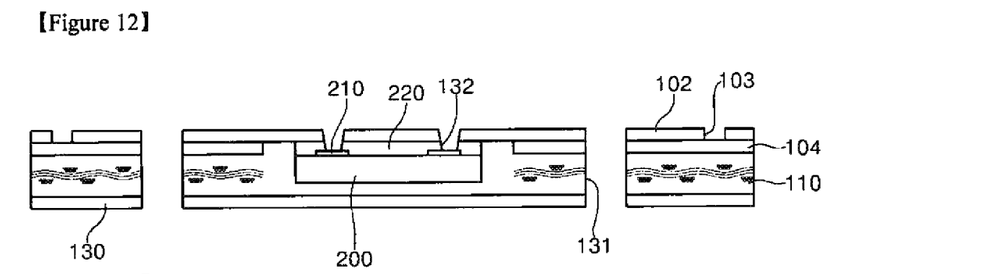

Next, as shown in FIG. 11, after the substrate is overturned so that the terminal 210 of the electronic devices 200 looks upward, as shown in FIG. 12, a through hole 131, which passes through the first insulating layer 110, is formed from the upper copper foil layer 102 to the lower copper foil layer 130.

The through hole 131 may be formed by a laser drilling process. However, unlike this, a machining process or a drilling process may be performed.

Also, a via hole 132, in which the terminal 210 of the electronic devices 200 is exposed, is formed by etching an area of from the upper copper foil layer 102 to the adhesive layer 220.

The via hole 132 may be formed by a physical drill process. Unlike this, it may be formed using a laser. When the via hole 132 is formed using the laser, the copper foil layer 102 and the adhesive layer 220 may open using a YAG laser or a CO2 laser.

Figure 13:
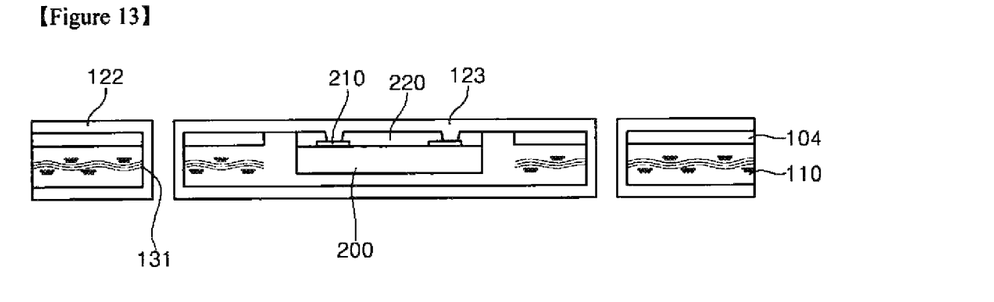
Figure 14:
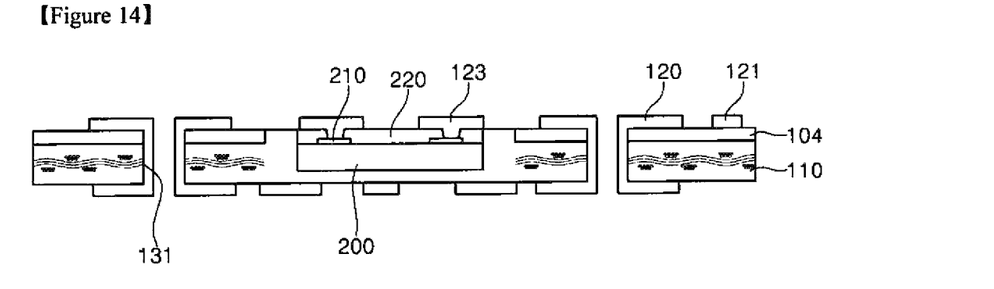

Next, as shown in FIG. 13, a plating layer 122 is formed to cover a side surface of the through hole 131 and the copper foil layer 102 of the upper part and the lower part. After the plating layer 122 is formed to embed the via hole 132, as shown in FIG. 14, the inner circuit pattern 121 is formed by patterning the plating layer 122, and the conductive via 120, which covers the via 123 and the through hole 131, is formed.

Figure 15:
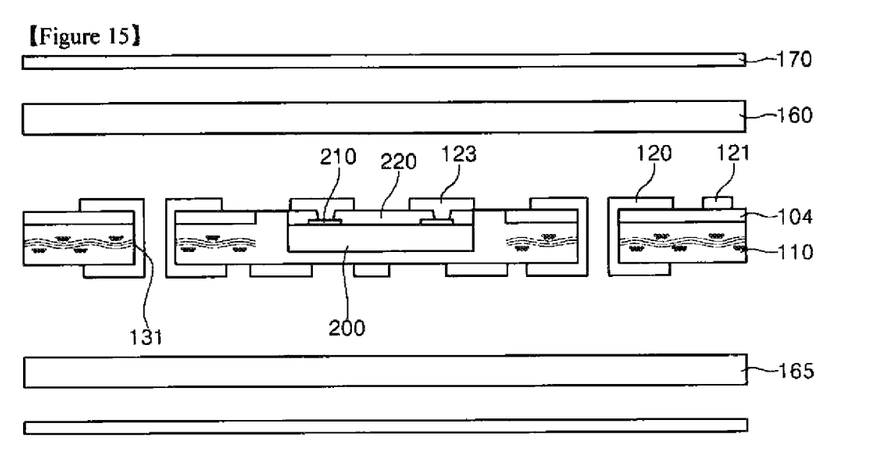
Figure 16:
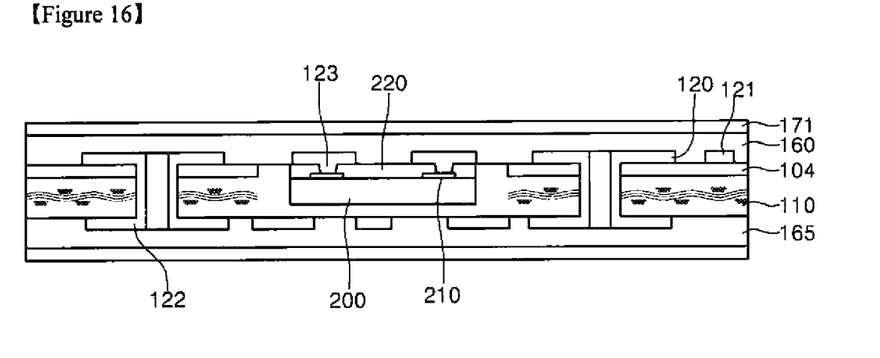

Then, as shown in FIG. 15, the second and third insulating layers 160, 165 and the lower and copper foil layer 171 are disposed on an upper surface and a lower surface of the first insulating layer to be pressurized, thereby forming a laminated structure of FIG. 16.

Figure 17:
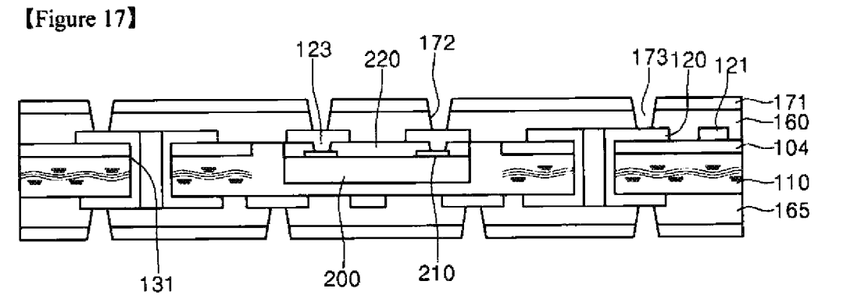

Then, as shown in FIG. 17, an upper via hole 172, in which the inner circuit pattern 121 or the vias 120, 123 is exposed, is formed by simultaneously etching the copper foil layer 171 and the second and third insulating layers 160, 165 having the laminated structure.

Figure 18:
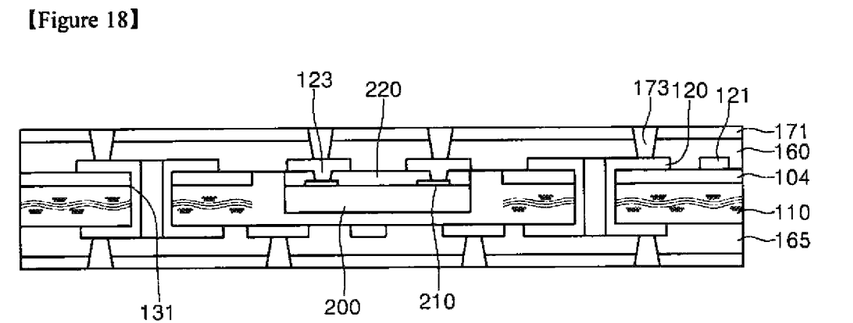
Figure 19:
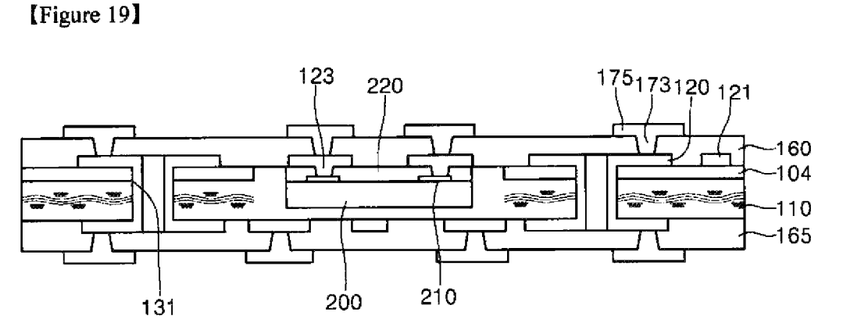

Next, as shown in FIG. 18, the upper via hole 172 is embedded by performing plating. As shown in FIG. 19, the outer circuit pattern 175 and the via 173 are formed by patterning the plating layer of the upper part and the lower part.

At this time, the upper via 173 is partially connected to the via 123 so that the terminal 210 of the electronic devices 200 is electrically exposed to the outside.

Figure 20:
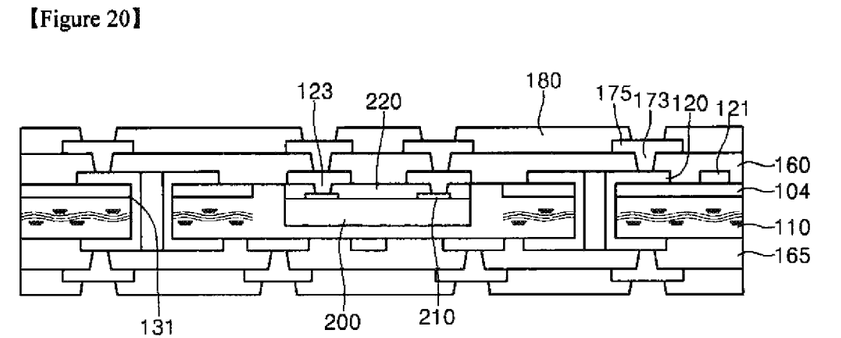
Figure 21:
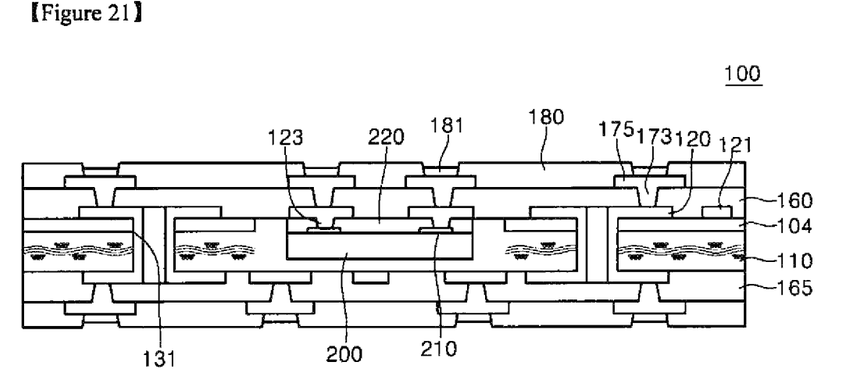

Next, as shown in FIG. 20, after the solder resist 180, which opens the via pad, is formed, the surface treatment layer 181 is formed on the exposed pad through plating, so as shown in FIG. 21, the printed circuit board 100 is completed.

Like this, in the embedded printed circuit board 100 in which the electronic devices 200 are embedded, when the electronic devices 200 are mounted, the adhesive layer 220 is formed on the surface, on which the terminal of the electronic devices 200 is formed so that the terminal 210 is fixed, and then the adhesive layer 220 is used as an insulating layer, whereby a thickness of the board can be reduced and a deviation in array can be also reduced by fixing the electronic devices 200.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A printed circuit board comprising:
an insulating layer;
an electronic device embedded in the insulating layer;
an adhesive layer for fixing the electronic device;
a guide layer for guiding an arrangement of the electronic device; and
an external insulating layer which covers the insulating layer,
wherein the guide layer has an opening in which the adhesive layer and the electronic device are disposed, and the insulating layer is disposed in the opening of the guide layer,
wherein the opening of the guide layer exposes a disposition area of the adhesive layer to be disposed on a carrier board,
wherein the guide layer is disposed only on one surface of the insulating layer,
wherein the insulating layer is in direct physical contact with a bottom surface of the adhesive layer and the electronic device,
wherein the adhesive layer has a same width as the electronic device,
wherein one surface of the adhesive layer is in contact with the electronic device, and another surface of the adhesive layer is in contact with the external insulating layer,
wherein a top surface of the insulating layer portions lies in a same plane as a top surface of the guide layer and a top surface of the adhesive layer,
wherein a bottom surface of the guide layer is higher than a bottom surface of the electronic device,
wherein the insulating layer comprises:
a first region disposed in the opening of the guide layer; and
a second region disposed under the bottom surface of the guide layer, and
wherein a thickness of the first region is same as a thickness including the second region and the guide layer.

2. The printed circuit board of claim 1, wherein the device area of the guide layer is formed to have a larger width than that of the electronic device.

3. The printed circuit board of claim 1, wherein the guide layer is disposed between, the insulating layer and the external insulating layer which covers the insulating layer.

4. The printed circuit board of claim 1, wherein the insulating layer comprises a device arrangement part in which the electronic device is disposed.

5. The printed circuit board of claim 1, wherein the electronic device is disposed in the insulating layer and are bonded to one surface of the external insulating layer by the adhesive layer.

6. The printed circuit board of claim 1, wherein the electronic device is a passive element or an active element.

7. The printed circuit board of claim 1, wherein the insulating layer comprises a resin material in which glass fabric is impregnated.

8. The printed circuit board of claim 1, wherein the adhesive layer is configured such that an adhesive paste is coated on both surfaces of a dry film.

9. The printed circuit board of claim 1, wherein the adhesive layer is formed to have a width identical to or larger than that of the electronic device.

10. The printed circuit board of claim 1, wherein the adhesive layer is configured to cover a terminal of the electronic device.

11. The printed circuit board of claim 1, further comprising an inner circuit pattern formed on the insulating layer.

12. The printed circuit board of claim 11, further comprising a via formed to pass through the adhesive layer so that the inner circuit pattern and the terminal of the electronic device are connected to each other.

13. The printed circuit board of claim 1, farther comprising an outer circuit pattern formed on the external insulating layer.

* * * * *